US005820692A

United States Patent [19]
Baecker et al.

[11] Patent Number: 5,820,692
[45] Date of Patent: Oct. 13, 1998

[54] VACUUM COMPATIBLE WATER VAPOR AND RINSE PROCESS MODULE

[75] Inventors: James J. Baecker, Minneapolis; D. Scott Becker, Excelsior; Michael J. Foline; Todd K. Maciej, both of Carver, all of Minn.

[73] Assignee: FSI Interntional, Chaska, Minn.

[21] Appl. No.: 591,175

[22] Filed: Jan. 16, 1996

[51] Int. Cl.$^6$ ........................................... B08B 5/04
[52] U.S. Cl. .................... 134/21; 134/23; 134/30; 134/54; 156/345; 156/625; 156/646; 156/657; 204/192.37; 204/298.25; 204/298.33; 414/217; 437/225
[58] Field of Search .................... 134/2, 21, 23, 134/26, 30, 31, 34, 54; 156/345, 646, 657, 625, 662; 204/192.32, 192.37, 298.31, 298.33, 298.25; 437/225; 414/217

[56] References Cited

U.S. PATENT DOCUMENTS

| | | | |
|---|---|---|---|
| 4,749,440 | 6/1988 | Blackwood et al. | 156/646 |
| 4,816,638 | 3/1989 | Ukai et al. | 219/121.43 |
| 4,857,142 | 8/1989 | Syverson | 156/646 |
| 4,900,395 | 2/1990 | Syverson et al. | 156/639 |
| 4,951,601 | 8/1990 | Maydan et al. | 118/719 |
| 5,067,218 | 11/1991 | Williams | 29/25.01 |
| 5,228,206 | 7/1993 | Granbt et al. | 34/1 |
| 5,292,393 | 3/1994 | Maydan et al. | 156/345 |
| 5,301,701 | 4/1994 | Nafziger | 134/95 |
| 5,403,434 | 4/1995 | Moslehi | 156/643 |

FOREIGN PATENT DOCUMENTS

| | | |
|---|---|---|
| 0 206 180 A | 12/1986 | European Pat. Off. . |
| 0 272 141 A2 | 6/1988 | European Pat. Off. . |

OTHER PUBLICATIONS

Product Brochure: "Excalibur® Vapor Chase Clening Syustems;" FSI International, Inc. (Aug. 1994).
Werkhoven et al, "Cluster–Tool Integrated HF Vapor Etching for Native Oxide Free Processing;" *Mat. Res. Soc. Symp. Proc.*, vol. 315, pp. 211–217 (1993),
Werkhoven et l, "Contamination Control of Polysilicon Gates In A Vertical Reactor Cluster lTool;" *Journal of the IES*, May–Jun. 1993, pp. 33–36.
Product Brochure: Primax™ Gas Phase Cleaning Module; SubMicron Systems, Inc. (not dated).
Izumi et al; "A New Cleaning Method By Using Anhydrous HF/CH$_3$OH Vapor System;" *The Electro Chemical Society Inc.*; vol. 92–12; pp. 260–266.
Product Brochre for Advantage 2000; Genus Inc.; 4 pgs; Jan. 4, 1994.

*Primary Examiner*—Laurie Scheiner
*Attorney, Agent, or Firm*—Vidas, Arrett & Steinkraus, P.A.

[57] ABSTRACT

A process module which can be integrated with a reduced pressure cluster tool system for semiconductor wafer processing to perform ambient or near ambient pressure reactions without requiring an intermediate buffer chamber. The process module includes:

a housing defining an evacuatable containment chamber;

an evacuation system for evacuating the containment chamber to a pressure below ambient pressure;

a process chamber in the interior of the housing adapted for performing a process operation on a substrate, at an operating pressure substantially above that of the pressure of the containment chamber, and including a substrate access port openable to the containment chamber, the substrate access port, when closed, isolating said process chamber from said containment chamber so that said containment chamber may be maintained at a lower pressure than the process chamber pressure during performance of said process operation, and the substrate access port, when opened to the containment chamber, permitting said evacuation means to evacuate the process chamber and the containment chamber to the same pressure.

A control system is provided which is operable to cause said access port to open and close, to operate said evacuation means and to perform said process operation according to a predetermined processing sequence.

21 Claims, 5 Drawing Sheets

VACUUM COMPATIBLE WATER VAPOR AND RINSE PROCESS MODULE

FIELD OF THE INVENTION

The present invention relates to an apparatus used in semiconductor wafer fabrication and related electronic process technologies. The apparatus allows ambient or near ambient pressure processes to be easily practiced with vacuum handler devices.

BACKGROUND OF THE INVENTION

Cleaning, rinsing, drying, and transferring wafers occur before many process steps in semiconductor wafer fabrication. Typically, these operations are performed at different workstations, each specifically designed for one particular operation. Also, typically, the wafers are manually transported from one dedicated workstation to the next. As device geometry and line widths shrink, and as wafer sizes increase, pressure to improve "cleanliness" of the overall process has risen. This pressure has lead to increased interest in cluster tools in which various process modules are mounted around a central handler, maintained under vacuum, which houses a robotic transfer tool. The transfer tool moves a wafer between the handler and the associated process modules according to a programmed processing sequence without any intermediate exposure of the wafer to human contact or the ambient environment. Handler pressures for such cluster tools are typically maintained in the range of about $10^{-4}$ to about 10 torr.

Processes which operate at pressures similar to, or even lower, than the handler pressure can be relatively easily adapted to be used with a cluster tool handler. However, a number of processes, particularly cleaning and rinsing processes using water vapor and/or aqueous liquids are not easily adapted for low pressure processing. Integration of such processes into a cluster tool has heretofore been quite difficult. One attempt to accomplish integration of an ambient pressure process module has utilized an intermediate buffer chamber which includes a secondary handler and which can be evacuated to the cluster tool handler pressure before a wafer is inserted into the buffer chamber from the cluster tool handler. After transfer of the wafer to the buffer chamber, and isolation from the cluster tool handler, the buffer chamber is brought up to the pressure of the process module so that the wafer can then be transferred into the process module without compromising the vacuum of the primary handler. This solution, however, has not been entirely satisfactory because of the expense and floor space required for the buffer chamber. There therefore exists a need for an improved apparatus and method for integrating an near ambient process with a vacuum cluster tool.

SUMMARY OF THE INVENTION

The present invention encompasses a process module which can be integrated with a reduced pressure cluster tool system without an intermediate buffer chamber. In one aspect the invention is a process module comprising:

a housing defining an evacuatable containment chamber;

evacuation means for evacuating the containment chamber to a pressure below ambient pressure;

a process chamber in the interior of the housing adapted for performing a process operation on a substrate, such as a semiconductor wafer, at an operating pressure substantially above that of the pressure of the containment chamber, and including a substrate access port openable to the containment chamber, the substrate access port, when closed, isolating said process chamber from said containment chamber so that said containment chamber may be maintained at a lower pressure than the process chamber pressure during performance of said process operation, and the substrate access port, when opened to the containment chamber, permitting said evacuation means to evacuate the process chamber and the containment chamber to the same pressure.

A further aspect of the invention is a process module for a cluster tool, the cluster tool comprising a handler unit, the handler unit including:

a process module mating surface comprising an openable entry port;

an interior compartment accessible through said entry port and maintained at a pressure below ambient pressure; and a transfer tool within the handler adapted to transport a processing substrate into and out of the handler via the entry port, the process module comprising:

a housing adapted to be mounted on said mating surface of the cluster tool handler, the housing, when so mounted, defining an evacuatable containment chamber;

evacuation means for evacuating the containment chamber to a pressure at or below the pressure of the handler interior compartment; and a process chamber in the interior of the housing adapted for performing a process operation on the substrate at an operating pressure substantially above that of the pressure of the interior compartment of the handler, the process chamber being spaced apart from said entry port by at least a portion of the containment chamber, and the process chamber further including an access port openable to the containment chamber, the access port being aligned with the entry port of the handler and sized to permit entry of said transfer tool and said substrate, whereby when both the entry port and the access port are opened, the transfer tool may transfer the substrate between the process chamber and the handler through said portion of the containment chamber, the access port, when closed, isolating said process chamber from said containment chamber so that said containment chamber may be maintained at a lower pressure than the process chamber pressure during performance of said process operation, and the access port, when opened to the containment chamber while the handler interior port is closed, permitting said evacuation means to evacuate the process chamber to a pressure at or below the pressure of the handler.

The process module of the invention are preferably provided with a programmable control system operable to independently cause said handler entry port and said process chamber access port to open and close, to operate said evacuation means and to perform said process operation according to a predetermined processing sequence. Such a control system may be independent of or interfaced and acting in concert with the control system of the handler.

DETAILED DESCRIPTION OF THE PREFERRED EMBODIMENT

Figure 1:
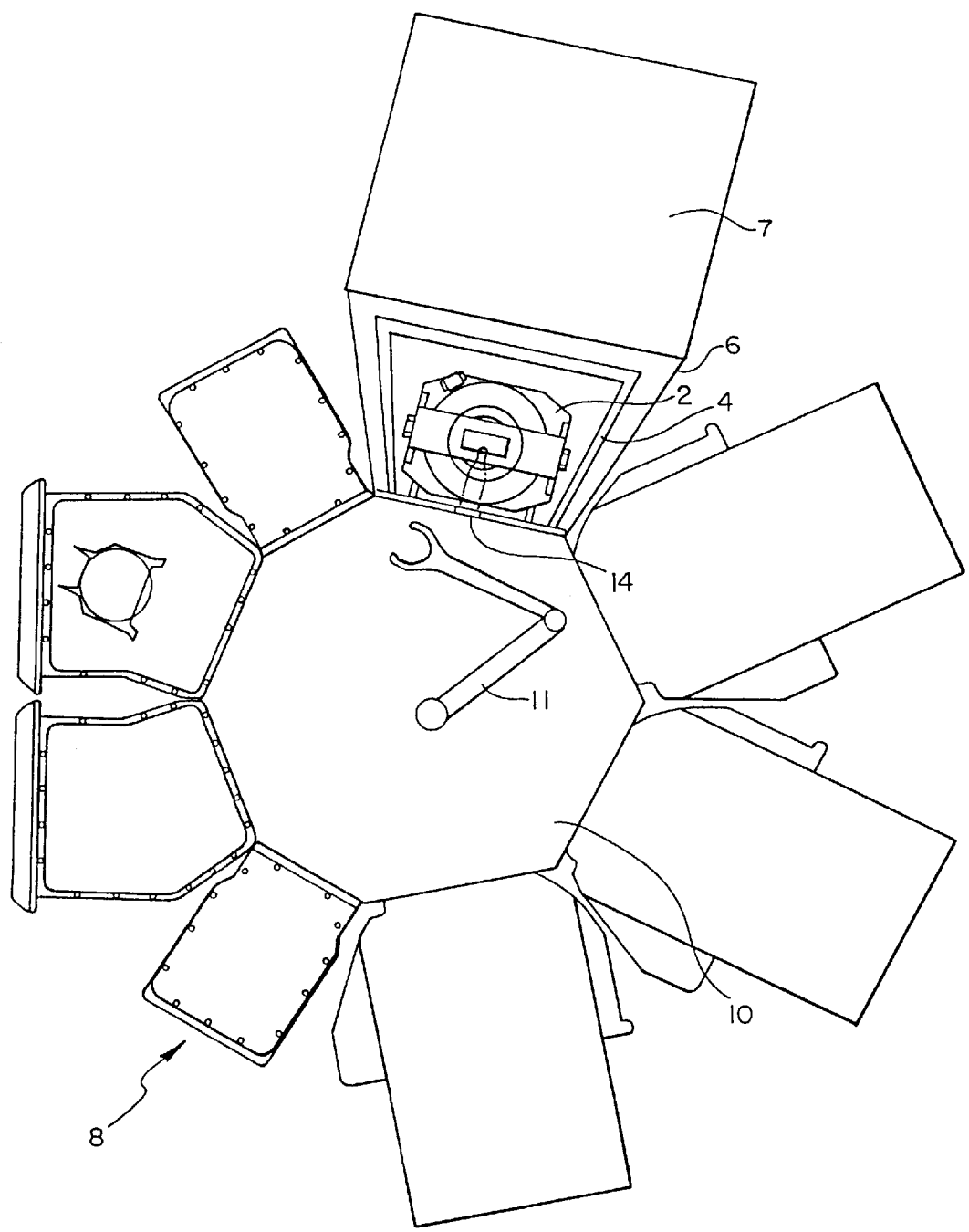
FIG. 1 is a schematic top plan view with parts cut away of a cluster tool which includes a process module of the invention thereon.

Referring to FIG. 1, a process tool 2 is shown located within the housing 4 of a process module 6. The process module 6 also comprises a control unit 7, which includes process controls, plumbing and chemicals as needed to control and service the process tool according to a programmed control sequence. The process module is installed as an element of a cluster tool generally designated by the numeral 8. Cluster tool 8 includes a central handler 10 in which a robotic transfer tool 11 is housed. A slit valve assembly 14 is provided as an integral part of the handler or the process module 6 or as a separate intermediate assembly of about 1.5" (3.8 cm) thickness. The slit valve assembly includes a slit valve which functions as an entry and exit port through which the wafer is transferred between the handler 10 and the process module 6 by the transfer tool 11.

Figure 2:
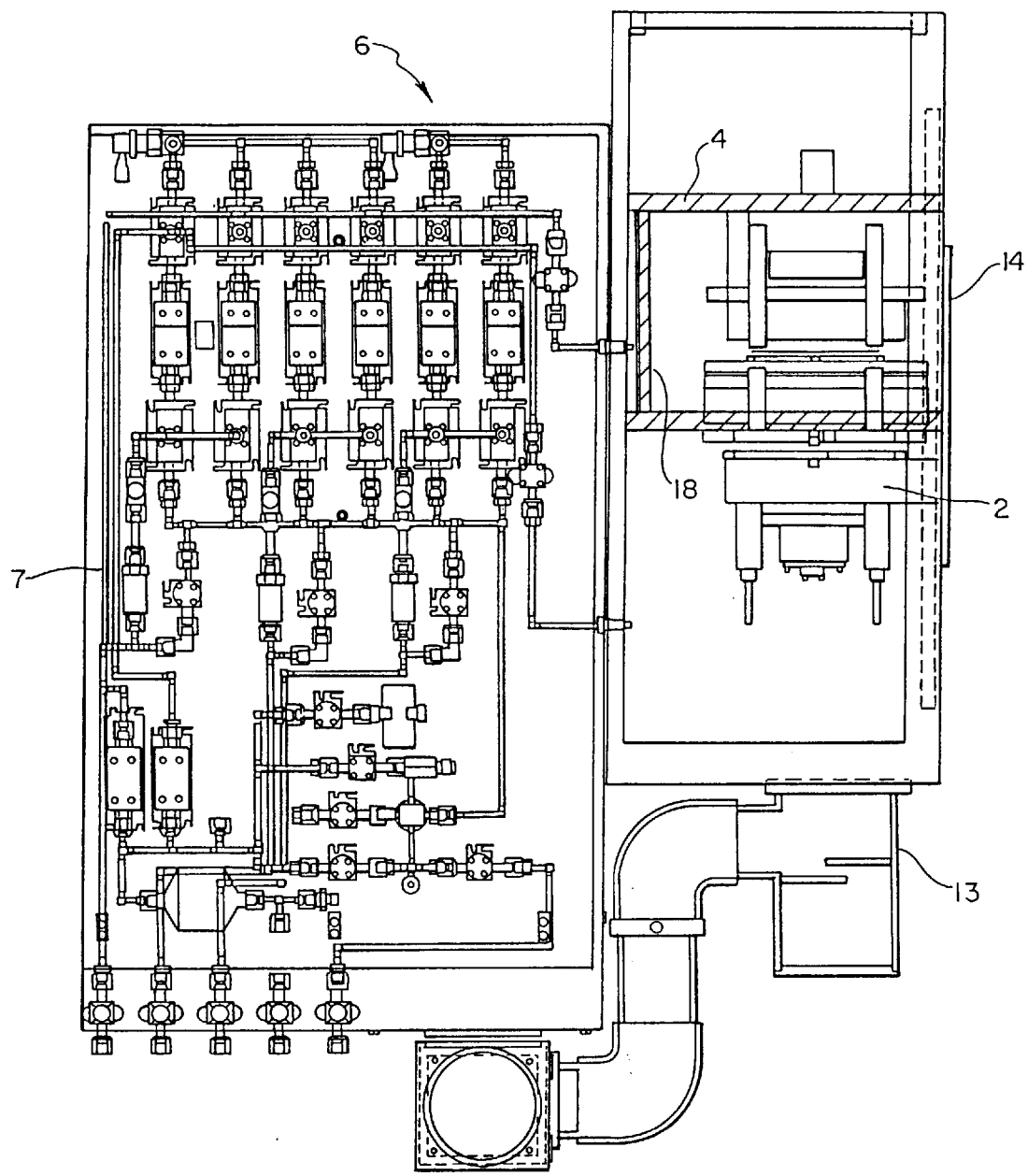
FIG. 2 is a schematic side sectional view of a process module of the invention.

FIG. 2 shows a schematic side sectional view of the process module 6. The process tool 2 includes a process chamber device 12 enclosed within a low pressure containment chamber 18 defined by the inner walls of housing 4. The process chamber is open and a wafer 16 is supported therein. A suitable process chamber device 12 is a HF/water vapor chamber such as the Excalibur® MVP process chamber sold by FSI International for surface oxides and contamination removal. Illustratively, the plumbing and chemicals supply apparatus in control unit 7 includes means for supplying HF, water vapor, HCl, ozone and liquid DI water to the process chamber according to a programed sequence. Other chemicals, however, may be suitably provided in place of, or in addition to, these specifically mentioned chemicals without departing from the invention hereof. For safety purposes ventilation of the cabinet of module 6 may be provided by exhaust vent 13.

Figure 3:
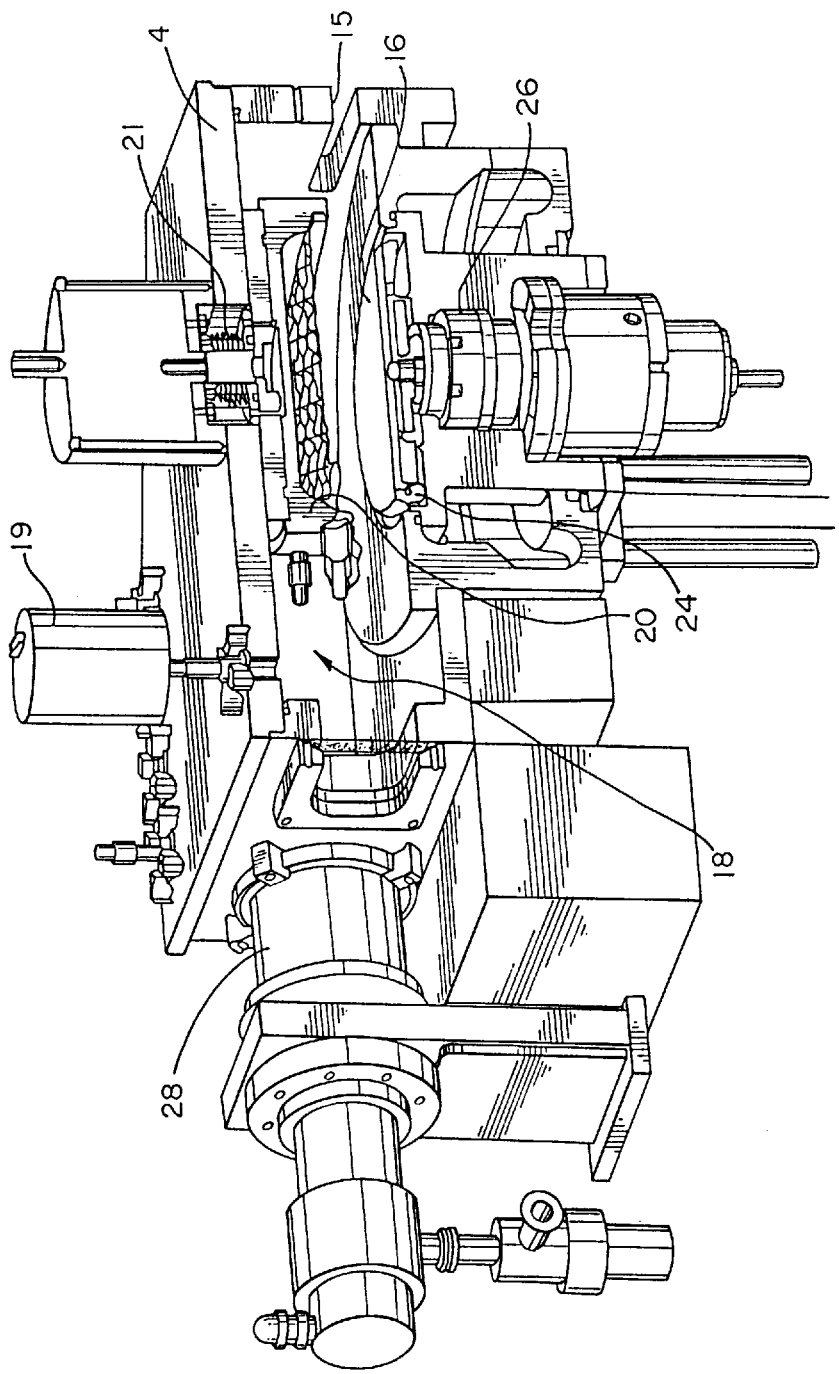
FIG. 3 is a cutaway perspective view of a process tool portion of the inventive process module with the processing chamber open to permit insertion or withdrawal of a wafer therefrom.

FIG. 3 provides a view of the housing 4 with the process tool in a position to accept the wafer. Pressure in the containment chamber is monitored by a pressure gauge 19. A slit opening 15, aligned with the slit valve of slit valve assembly 14, provides access for wafer insertion into housing 4. The process tool is mounted near the opening 15 so that the handler can insert and remove the wafers from the process tool. As the typical handler transfer robot is limited to an travel length of about 12 inches beyond the handler wall, the center of the process tool is suitably located within this distance from the handler wall. In the wafer receiving position, the lid 20 of the process chamber is raised by lid lifter 21 so that the handler can transfer the wafer to the interior of the chamber. The wafer process tool is provided with a wafer carrier 24 which is rotatable by motor 26. A high vacuum turbo pump 28 is provided to evacuate the containment chamber 18 and, because the process tool is open to chamber 18 when in the receiving position, the process chamber portion of the device is likewise evacuated by pump 28.

Figure 4:
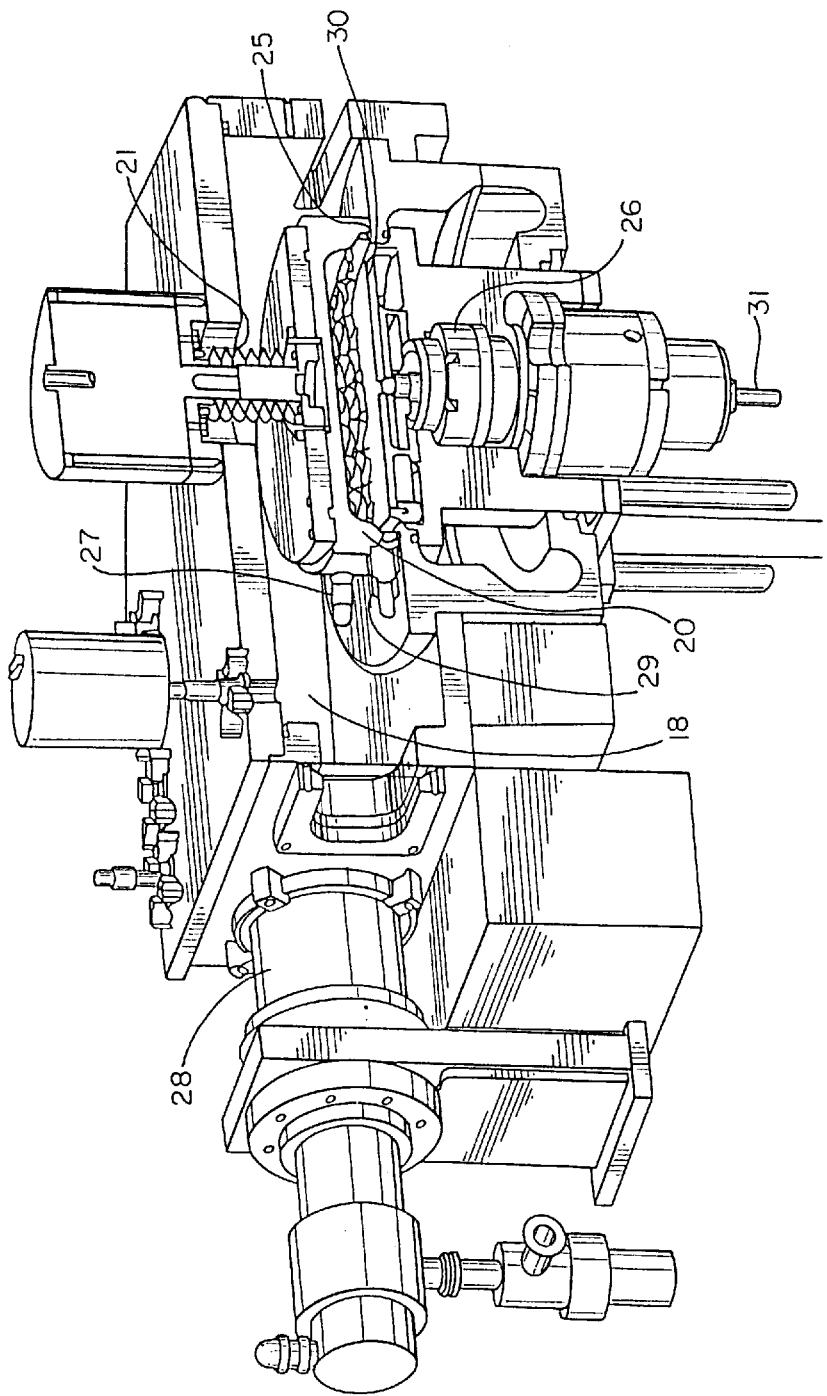
FIG. 4 is a view as in FIG. 3 with the chamber lid closed for gas phase processing of the wafer.

FIG. 4 is a view as in FIG. 3 except that the process tool lid 20 has been lowered by lid lifter 21 to the chemical processing position in which the wafer is treated with processing chemicals such as HF/water vapor. The lowered lid 20 defines a process chamber 30 isolated from the containment chamber 18 by seal 25. The process chamber 30 can then be provided with process gases at or near atmospheric pressure while the containment chamber 18 is held under vacuum. The process gases flow into the process tool via input conduit 27 and are removed via output conduit 29. Backside treatment can be provided by supplying process gas through port 31. Alternatively, backside protection of the wafer can be facilitated by supplying dry Nitrogen or other inert gas through port 31.

Figure 5:
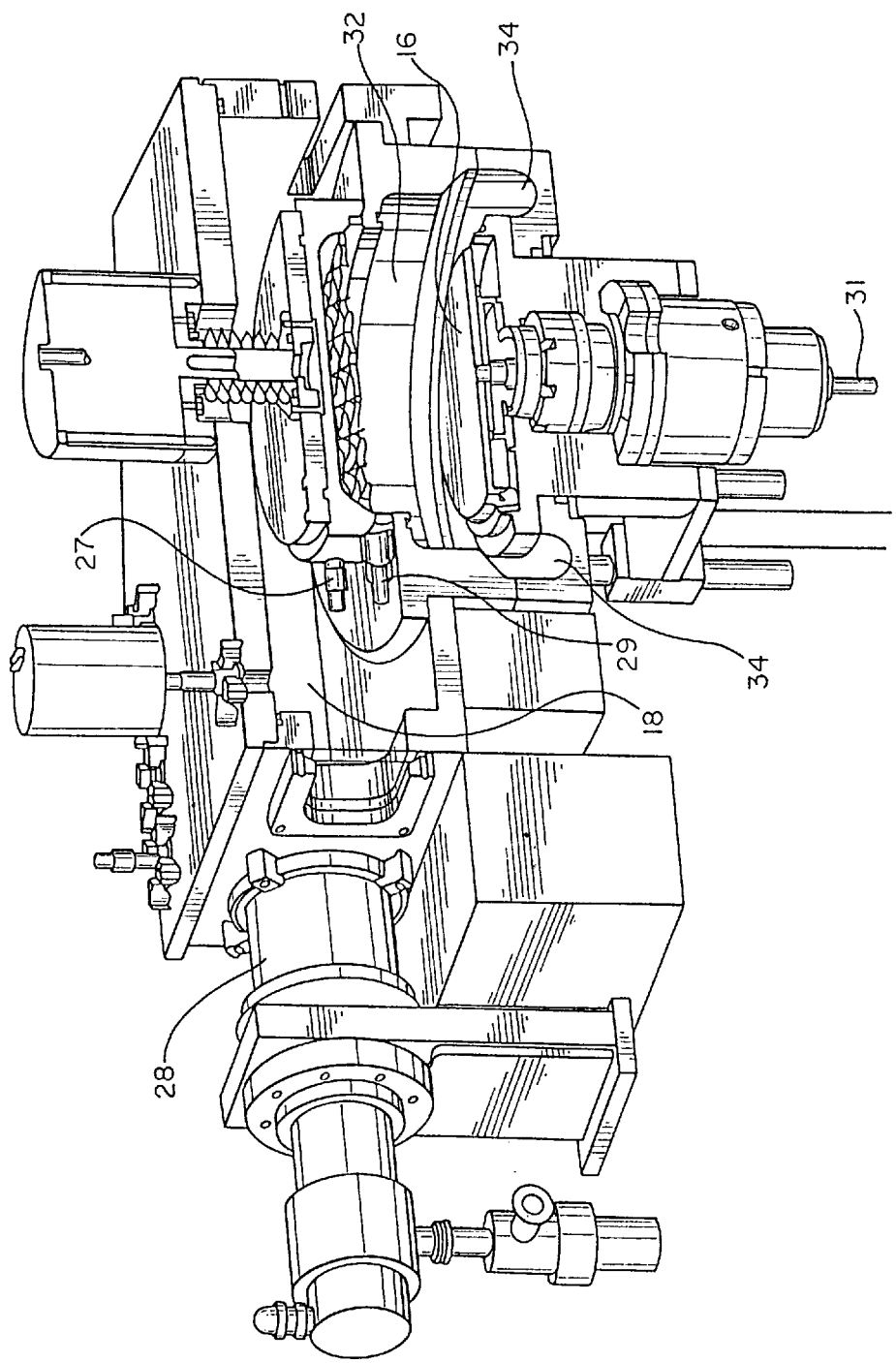
FIG. 5 is a view as in FIG. 4 with the processing chamber enlarged by lowering of the wafer carrier assembly for rinsing or other liquid phase processing of the wafer.

FIG. 5 is a view as in FIG. 4 except that the wafer carrier assembly has been lowered to a rinse processing position, enlarging the processing chamber to include lower portion 32. In the rinse processing position rinse water is sprayed on the rotating wafer from spray nozzles, not shown, located in lower portion 32 of the processing chamber. During rinsing the wafer is spun so that the rinse water is centrifugally dispensed into collection trough 34, from which it is drained via drain conduits, not shown. Backside rinsing may be accomplished by simultaneously feeding rinse water through port 31. Upon completion of the rinse step, the wafer is spun dry and then the carrier assembly is raised back to the processing position of FIG. 4. O-ring seal 38 isolates the collection trough 34 from the upper part of the processing chamber when the carrier assembly is raised so that any undrained rinse water need not be evaporated prior to evacuation of the processing chamber and the processing chamber's volume is reduced to expedite evacuation.

To evacuate the processing chamber in preparation for removal of the processed wafer, the processing chamber lid may simply be opened, relying on vacuum pump 28 to evacuate the combined containment and processing chamber volumes. More efficient evacuation is provided, however, if while the processing chamber is still closed, the chamber is purged with dry nitrogen and any residual liquid water pumped out of port 31 by a separate pump connected to port 31. The entire process chamber is then suitably pumped down to an intermediate pressure between the processing pressure and the pressure of chamber 18 using a roughing pump which is suitably connected to ports 27 and 29. Such partial evacuation of the process chamber, results in a less drastic pressure change upon opening of the process chamber to containment chamber 18, reducing turbulence which might give rise to contamination problems and more rapid reequilibration of the containment chamber pressure.

In the preferred embodiment wafers are processed at near atmospheric pressure (600 to about 900 torr), typically 760 to 800 torr, while inside the process chamber. When the processing has been completed, the process chamber is purged with dry nitrogen. Heat may be applied to the process chamber or the purge gas may be heated above ambient to facilitate moisture removal. Subsequent to purging, the pressure is reduced inside the process chamber to about 1 torr and then the process chamber opened by lifting the lid 20 to the position shown in FIG. 3. The pressure of the containment chamber 18 is adjusted to below that of the handler, suitably to about $10^{-4}$ torr or less, and then backfilled with dry nitrogen to the handler pressure, typically about $10^{-4}$–10 torr. When the containment chamber is at the handler pressure the slit valve of slit valve assembly 14 is opened and to allow the transfer tool 11 to retrieve the processed wafer.

With a pumpdown to $10^{-4}$ torr and backfill to 10 torr the moisture content of the containment chamber 18 will be about 10 ppm H$_2$O, which is a significant benefit for semiconductor wafer processing.

The cleaning and rinsing cycle can be adapted to accommodate both vapor phase and liquid phase chemical processing. For instance, the rinse position shown in FIG. 5 may be utilized to apply conventional wet chemicals such as hydrogen peroxide, hydrofluoric acid, hydrochloric acid, isopropyl alcohol, sulfuric acid, and acetone, in addition to rinse water. The gas delivery system can be used to supply various process gases and gas mixtures including water vapor, anhydrous hydrofluoric acid, hydrochloric acid, ozone, isopropyl alcohol, chlorine, fluorine and chlorine trifluoride, as well as nitrogen, argon and other inert gases. Other process gases and liquids will be readily apparent to those skilled in the art and therefore their use should be considered to come within the scope of this invention.

Other variations on the structure of the inventive apparatus as described in the following claims will also be apparent to the skilled person and so the invention should not be considered limited to preferred embodiment described herein.

What is claimed is:

1. A process module for a cluster tool, the cluster tool comprising a handler unit, the handler unit including:
    a process module mating surface comprising an openable entry port;
    an interior compartment accessible through said entry port and maintained at a pressure below ambient pressure; and
    a transfer tool within the handler adapted to transport a processing substrate into and out of the handler via the entry port,
the process module comprising:
    a housing adapted to be mounted on said mating surface of the cluster tool handler, the housing, when so mounted, defining an evacuatable containment chamber;
    evacuation means for evacuating the containment chamber to a pressure at or below the pressure of the handler interior compartment; and
    a process chamber in the interior of the housing adapted for performing a process operation on the substrate at an operating pressure substantially above that of the pressure of the interior compartment of the handler, the process chamber being spaced apart from said entry port by at least a portion of the containment chamber, and the process chamber further including an access port openable to the containment chamber,
        the access port being aligned with the entry port of the handler and sized to permit entry of said transfer tool and said substrate, whereby when both the entry port and the access port are opened, the transfer tool may transfer the substrate between the process chamber and the handler through said portion of the containment chamber,
        the access port, when closed, isolating said process chamber from said containment chamber so that said containment chamber may be maintained at a lower pressure than the process chamber pressure during performance of said process operation, and
        the access port, when opened to the containment chamber while the handler entry port is closed, permitting said evacuation means to evacuate the process chamber to a pressure at or below the pressure of the handler.

2. A process module as in claim 1 further comprising a control system operable to independently cause said handler entry port and said process chamber access port to open and close, to operate said evacuation means and to perform said process operation according to a preselected processing sequence.

3. A process module as in claim 2 wherein said control system is configured to perform a preselected processing sequence comprising the sequential steps of:
    (a) opening the process chamber access port;
    (b) evacuating the containment chamber and the process chamber to a first preselected pressure at or below the handler pressure;
    (c) opening the handler entry port;
    (d) operating the handler tool to transfer a substrate from the handler interior compartment to the processing chamber;
    (e) closing the entry and access ports;
    (f) performing a said processing operation on said substrate at a pressure above the pressure of the handler interior compartment;
    (g) opening the process chamber access port;
    (h) evacuating the containment chamber and the process chamber to a second preselected pressure at or below the handler pressure, which may be the same or different than said first preselected pressure;
    (i) opening the handler entry port; and
    (j) operating the handler tool to transfer the substrate from the processing chamber to the handler interior compartment.

4. A process module as in claim 3 further comprising an auxiliary evacuation means for reducing the pressure in the process chamber to a pressure between the process operating pressure and the pressure of the containment chamber while the access port is closed and wherein said processing sequence includes the further steps of:
    reducing the pressure in the process chamber to a pressure between the process operating pressure and the pressure of the containment chamber prior to said step (a) and
    reducing the pressure in the process chamber to a pressure between the process operating pressure and the pressure of the containment chamber between said step (f) and said step (g).

5. A process module as in claim 3 wherein in step (b) said first preselected pressure is below the handler pressure and the processing sequence further includes the step of backfilling the containment chamber and process chamber to the handler pressure with dry inert gas between step (b) and step (c).

6. A process module as in claim 5 wherein in step (h) said second preselected pressure is below the handler pressure and the processing sequence further includes the step of backfilling the containment chamber and process chamber to the handler pressure with dry inert gas between step (h) and step (i).

7. A process module as in claim 1 further comprising an auxiliary evacuation means for reducing the pressure in the process chamber to a pressure between the process operating pressure and the pressure of the containment chamber while the access port is closed.

8. A process module as in claim 7 wherein said process chamber includes liquid fluid supply means for supplying liquid process fluids to said process tool, and liquid removal means for removing the liquid process fluids from said process chamber while the access port is closed.

9. A process module as in claim 8 wherein the liquid removal means includes a liquid collection trough at the bottom of the chamber during processing, and isolatable from the chamber after processing while the access port is closed.

10. A process module as in claim 9 wherein the process chamber includes a rotatable substrate support holding the substrate in the chamber during processing and operable to spin-dry the substrate.

11. A process module as in claim 8 wherein said liquid supply means includes means for supplying an aqueous liquid.

12. A method of operating a process module as in claim 1 comprising the steps of:

(a) opening the process chamber access port;

(b) evacuating the containment chamber and the process chamber to a first preselected pressure at or below the handler pressure;

(c) opening the handler entry port;

(d) operating the handler tool to transfer a substrate from the handler interior compartment to the processing chamber;

(e) closing the entry and access ports;

(f) performing a said processing operation on said substrate at a pressure above the pressure of the handler interior compartment;

(g) opening the process chamber access port;

(h) evacuating the containment chamber and the process chamber to a second preselected pressure at or below the handler pressure, which may be the same or different than said first preselected pressure;

(i) opening the handler entry port; and (j) operating the handler tool to transfer the substrate from the processing chamber to the handler interior compartment.

13. A process as in claim 12 further comprising the steps of:

reducing the pressure in the process chamber to a pressure between the process operating pressure and the pressure of the containment chamber prior to said step (a) and reducing the pressure in the process chamber to a pressure between the process operating pressure and the pressure of the containment chamber between said step (f) and said step (g).

14. A process as in claim 12 wherein in step (b) said first preselected pressure is below the handler pressure and the process further comprises the step of backfilling the containment chamber and process chamber to the handler pressure with dry inert gas between step (b) and step (c).

15. A process as in claim 14 wherein in step (h) said second preselected pressure is below the handler pressure and the process further comprises the step of backfilling the containment chamber and process chamber to the handler pressure with dry inert gas between step (h) and step (i).

16. A process module comprising:

a housing defining an evacuatable containment chamber;

evacuation means for evacuating the containment chamber to a pressure below ambient pressure; and a process chamber in the interior of the housing adapted for performing a process operation on a substrate at an operating pressure substantially above that of the pressure of the containment chamber, and including a substrate access port openable to the containment chamber, the substrate access port, when closed, isolating said process chamber from said containment chamber so that said containment chamber may be maintained at a lower pressure than the process chamber pressure during performance of said process operation, and the substrate access port, when opened to the containment chamber while the handler interior port is closed, permitting said evacuation means to evacuate the process chamber and the containment chamber to the same pressure.

17. A process module as in claim 16 further comprising a control system operable to cause said access port to open and close, to operate said evacuation means and to perform said process operation according to a preselected processing sequence.

18. A process module as in claim 16 further comprising an auxiliary evacuation means for reducing the pressure in the process chamber to a pressure between the process operating pressure and the pressure of the containment chamber while the substrate access port is closed.

19. A process module as in claim 18 wherein said process chamber includes liquid fluid supply means for supplying liquid process fluids to said process tool, and liquid removal means for removing the liquid process fluids from said process chamber while the substrate access port is closed.

20. A process module as in claim 19 wherein the liquid removal means includes a liquid collection trough at the bottom of the chamber during processing, and isolatable from the chamber after processing while the substrate access port is closed.

21. A process module as in claim 20 wherein the process chamber includes a rotatable substrate support holding the substrate in the chamber during processing and operable to centrifugally dry the substrate.

* * * * *